(12) United States Patent
Liu et al.

(10) Patent No.: US 6,364,003 B1
(45) Date of Patent: Apr. 2, 2002

(54) DEVICE AND METHOD FOR ABSORBING AND RADIATING HEAT IN VERY SMALL SPACE BY ALTERNATELY PUSHING TWO FLUIDS

(76) Inventors: Ming-Hwa Liu, No. 117, Chung Chun Rd., Pei Tou Chen, Chang Hua Hsien; Brian D. F. Chen, No. 205, Li Der Street, East District, Taichung; Paug Chang Cheng, No. 36-2, Ting Yuan Lin, Ta Lin Chen, Chia Yih Hsien, all of (TW)

(*) Notice: Subject to any disclaimer, the term of this patent is extended or adjusted under 35 U.S.C. 154(b) by 0 days.

(21) Appl. No.: 09/862,298

(22) Filed: May 23, 2001

(51) Int. Cl.⁷ ............................................. F28D 15/00
(52) U.S. Cl. ........................... 165/104.28; 165/104.34; 165/104.23; 361/698; 361/700; 257/714
(58) Field of Search .................. 165/185, 80.4, 165/104.28, 104.23, 104.34; 174/15.1; 361/698, 699, 700; 257/714, 715, 716

(56) References Cited

U.S. PATENT DOCUMENTS

| | | | | |
|---|---|---|---|---|
| 3,605,878 A | * | 9/1971 | Coleman | 165/104.28 |
| 4,164,253 A | * | 8/1979 | Skala | 165/104.28 |
| 4,921,041 A | * | 5/1990 | Akachi | 165/104.29 |
| 4,967,831 A | * | 11/1990 | Leland | 165/104.25 |
| 5,316,077 A | * | 5/1994 | Reichard | 165/104.28 |
| 6,167,955 B1 | * | 1/2001 | Van Brocklin et al. | 165/104.26 |

* cited by examiner

Primary Examiner—Henry Bennett
Assistant Examiner—Terrell McKinnon
(74) Attorney, Agent, or Firm—Troxell Law Office PLLC

(57) ABSTRACT

A heat absorbing and radiating device includes a driving unit having communicable first fluid outlets and fourth fluid inlets, a heat-exchange unit communicating at an end with third fluid outlets of the driving unit and at another end with an inlet end of a liquid-gas confluence unit, which communicates at an outlet end with an inlet end of a liquid-gas separation chamber, while the latter communicates at an outlet end with one of two second fluid inlets of the driving unit. The driving unit is provided therein with reciprocatingly movable magnets to alternately push first and second fluids into the heat-exchange unit before them enter the fluid-gas confluence unit, so that hot air is finally released from the liquid-gas separation chamber. Since radiating fins and cooling fan are omitted, the device has reduced volume for use with a heat source in a small space, such as a CPU of a portable computer.

19 Claims, 4 Drawing Sheets

DEVICE AND METHOD FOR ABSORBING AND RADIATING HEAT IN VERY SMALL SPACE BY ALTERNATELY PUSHING TWO FLUIDS

BACKGROUND OF THE INVENTION

The present invention relates to a heat absorbing and radiating device, and more particularly to a miniature heat absorbing and radiating device suitable for use with a heat source in a very small space, such as a central processing unit (CPU) of a portable computer or a personal digital assistant (PDA). The twenty-first century is an electronic information era. With developments in the semiconductor field, new models of various electronic products, such as desktop computers, portable computers, PDAs, mobile phones, and smart electrical appliances, have been continuously introduced into the markets. All these products are designed to have a compact volume for users to carry and use them at any time to access real-time information. All the above-mentioned electronic products developed for the information industry include a central processing unit (CPU) that controls the entire operation of the electronic products. The CPU generates a large amount of heat and accordingly high temperature that adversely affects the operating efficiency and usable life of the products. Thus, it is always an important issue among the manufacturers to effectively cool the CPU. The currently available solutions of cooling the CPU include the provision of a group of radiating fins and a cooling fan at outer side of the CPU, and the improvement of heat-radiating fins in their material and structure in order to more quickly radiate heat produced by the CPU. However, all these currently available solutions are passive ways with limited radiation efficiency. Moreover, the cooling fan occupies a considerable space and does not meet the requirement of compact design.

SUMMARY OF THE INVENTION

It is therefore a primary object of the present invention to provide a miniature heat absorbing and radiating device having a driving unit for alternately pushing two types of fluid to actively and effectively lower the temperature of a heat-source in a very small space.

Another object of the present invention is to provide a miniature heat absorbing and radiating device that has a driving unit for alternately pushing two types of fluid and does not require conventional radiating fins and cooling fans, so as to occupy only very small space.

A further object of the present invention is to provide a method for absorbing and radiating heat produced by a heat source in a very small space.

To achieve the above and other objects, the present invention provides a miniature heat absorbing and radiating device that includes a first driving unit, a heat-exchange unit, a liquid-gas confluence unit, and a liquid-gas, separation chamber. The first driving unit includes a chamber in which an active magnet, a pair of fixed magnets, and a pair of passive magnets are provided. The chamber is also provided on a wall with a pair of first fluid outlets, a pair of second fluid inlets, a pair of third fluid outlets, and a pair of fourth fluid inlets. The heat-exchange unit communicates with the first driving unit and the liquid-gas confluence unit, and the liquid-gas separation chamber communicates with the liquid-gas confluence unit and one of the second fluid inlets.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 schematically shows a first driving unit adopted in a miniature heat absorbing and radiating device according to a first preferred embodiment of the present invention.

DETAILED DESCRIPTION OF THE PREFERRED EMBODIMENTS

Please refer to FIGS. 1 through 6. The present invention mainly relates to a miniature heat absorbing and radiating device that includes a driving unit for alternately driving two different fluids.

The present invention also relates to a method for absorbing and radiating heat in a very small space by pushing alternately two different fluids included in a miniature heat absorbing and radiating device. The device according to a first preferred embodiment of the present invention, as shown in FIGS. 1 to 5, mainly includes a first driving unit 11, a heat-exchange unit 12, a liquid-gas confluence unit 13, and a liquid-gas separation chamber 14.

Figure 1:
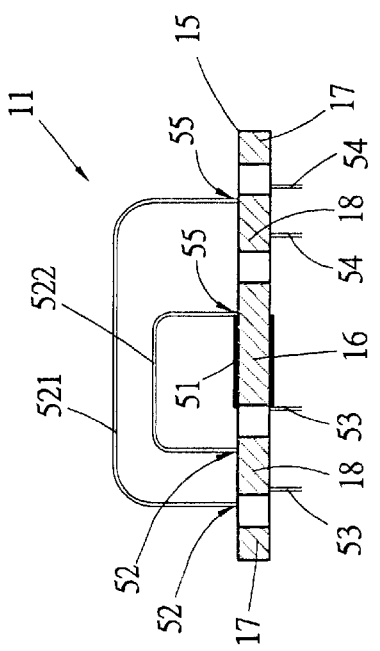

As can be seen in FIG. 1, the first driving unit 11 includes a chamber 15 that is in the form of a tube having a predetermined shape, length and internal space, an active magnet 16, a pair of fixed magnets 17, and a pair of passive magnets 18.

The active magnet 16 has a predetermined length and an exterior shape corresponding to an interior shape of the chamber 15, and is adapted to reciprocatingly move within a middle section of the chamber 15. A coil 51 is provided around an outer wall of the chamber 15 at a portion corresponding to the active magnet 16.

The coil 51 is electrically connected to a circuit to obtain from the circuit a cyclically variable current direction for the active magnet 16 to reciprocate in the chamber 15.

The pair of fixed magnets 17 includes a left and a right magnet 17, as viewed in front of the drawings, to separately fixedly locate at and space from two ends of the active magnet 16 by a predetermined distance. Each fixed magnet 17 has a predetermined length and an exterior shape corresponding to the interior shape of the chamber 15.

The pair of passive magnets 18 includes a left and a right magnet 18, as viewed in front of the drawings, to separately locate and reciprocatingly move between the active magnet 16 and the left and the right fixed magnet 17, respectively. Each passive magnet 18 has a predetermined length and an exterior shape corresponding to the interior shape of the chamber 15.

The active magnet 16, the fixed magnets 17 and the passive magnets 18 are so arranged that ends thereof having the same polarity are located at the same side.

Figure 2:
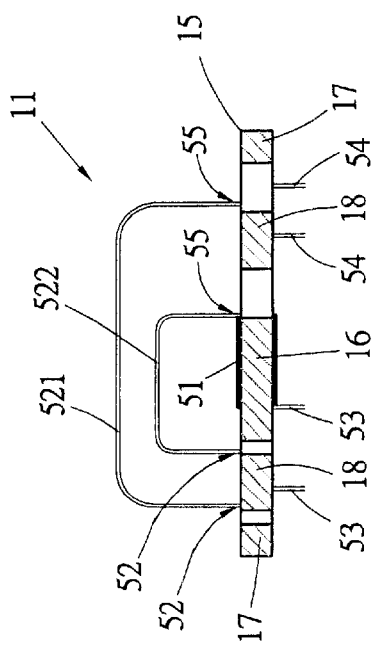
FIGS. 2, 3 and 4 illustrate the operation of the first driving unit of FIG. 1.
Figure 3:
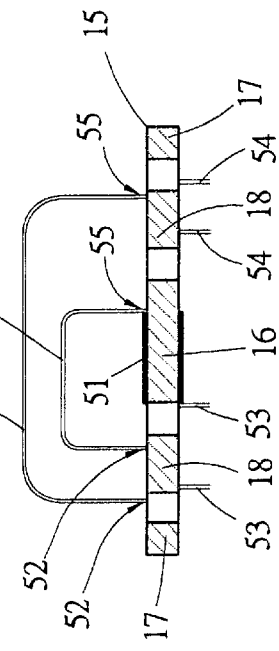
Figure 4:
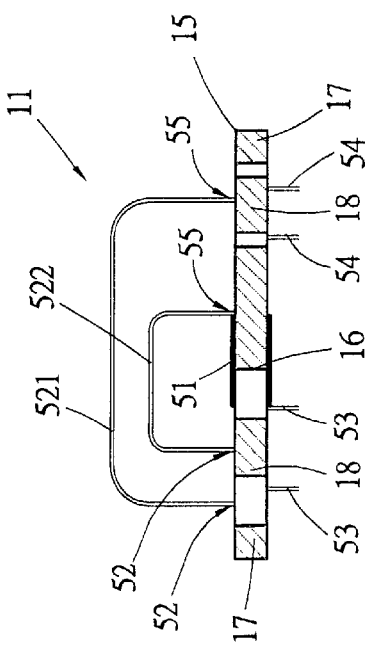
Figure 5:
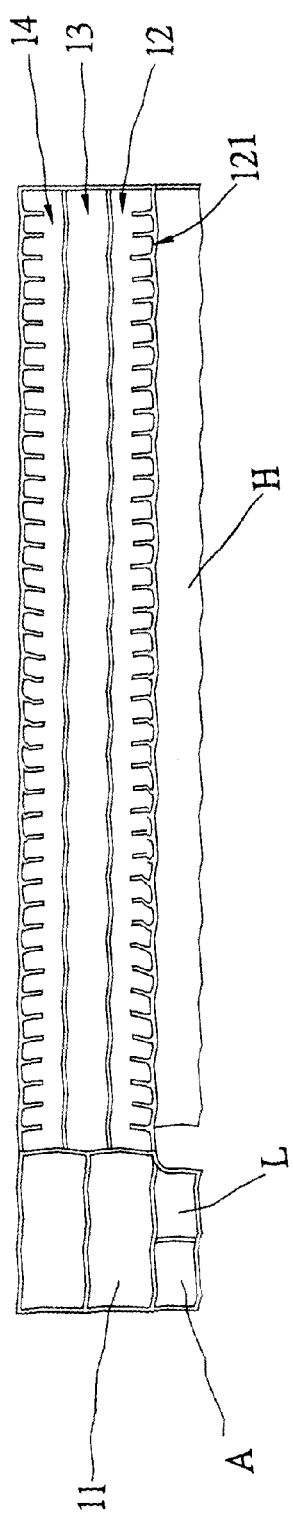
FIG. 5 is a sectional view showing the structure of the miniature heat absorbing and radiating device according to the first preferred embodiment of the present invention including a first and second fluid storage.

The chamber 15 is provided on its wall at portions between the active magnet 16 and the left fixed magnet 17 with a pair of first fluid outlets 52 and a pair of second fluid inlets 53, such that when the active magnet 16 reciprocates in the chamber 15 and causes the left passive magnet 18 to move reciprocatingly, the following conditions are observed:

(A) When, the left passive magnet 18 is moved leftward to reach a maximum displacement thereof, as shown in FIG. 2, only a right one of the two first fluid outlets 52 that is located between the active magnet 16 and the left passive magnet 18 is opened;

(B) When the left passive magnet 18 is moved rightward not to reach a maximum displacement thereof, as shown in FIG. 3, a left one of the two first fluid outlets 52 that is located between the left fixed magnet 17 and the left passive magnet 18 as well as a right one of the two second fluid inlets 53 that is located between the active magnet 16 and the left passive magnet 18 are opened, while the right one of the two first fluid outlets 52 and a left one of the two second fluid inlets 53 are closed; and (C) When the left passive magnet 18 is moved rightward to reach a maximum displacement thereof, as shown in FIG. 4, only the right one of the two first fluid outlets 52 that is located between the active magnet 16 and the left passive magnet 18 is closed.

The chamber 15 is also provided on its wall at positions between the active magnet 16 and the right fixed magnet 17 with a pair of third fluid outlets 54 and a pair of fourth fluid inlets 55, such that when the active magnet 16 reciprocates in the chamber 15 and causes the right passive magnet 18 to move reciprocatingly, the following conditions are observed:

(D) When the left passive magnet 18 is moved leftward to reach a maximum displacement thereof, as previously described in (A) and shown in FIG. 2, only a left one of the two third fluid outlets 54 that is located between the active magnet 16 and the right passive magnet 18 is closed;

(E) When the left passive magnet 18 is moved rightward not to reach a maximum displacement thereof, as previously described in (B) and shown in FIG. 3, only a right one of the two third fluid outlets 54 that is located between the right fixed magnet 17 and the right passive magnet 18 is opened; and (F) When the left passive magnet 18 is moved rightward to reach a maximum displacement thereof, as previously described in (C) and shown in FIG. 4, only the left one of the two third fluid outlets 54 that is located between the active magnet 16 and the right passive magnet 18 is opened.

Moreover, a first communicating tube 521 is provided to extend from the left one of the first fluid outlets 52 between the left fixed magnet 17 and the left passive magnet 18 to a right one of the fourth fluid inlets 55 between the right passive magnet 18 and the right fixed magnet 17, in order to transfer a first fluid, such as air, provided in the chamber 15.

A second communicating tube 522 is provided to extend from the right one of the first fluid outlets 52 between the active magnet 16 and the left passive magnet 18 to a left one of the fourth fluid inlets 55 between the active magnet 16 and the right passive magnet 18, in order to transfer a second fluid, such as a type of refrigerant, provided in the chamber 15.

The heat-exchange unit 12 includes at least an expansion tube 121 having a predetermined length. The expansion tube 121 is connected at an end, that is, an inlet end, to the pair of third fluid outlets 54 to communicate with the latter. An outer side of the expansion tube 121 is pressed against a heat source H, for example, a Central Processing Unit (CPU).

The liquid-gas confluence unit 13 is a tube having a predetermined length. The liquid-gas confluence unit 13 is connected at an end, that is, an inlet end, to the other end, that is, an outlet end, of the expansion tube 121 to communicate with the latter, so as to release a pressure from a mixed gas produced after a heat exchange in the heat-exchange unit 12.

The liquid-gas separation chamber 14 has a predetermined internal space and is communicable with the other end, that is, an outlet end, of the liquid-gas confluence unit 13 and with the right one of the second fluid inlets 53 between the active magnet 16 and the left passive magnet 18. The liquid-gas separation chamber 14 is provided on its wall with an opening covered with a thin venting layer, so that hot air is discharged from the liquid-gas separation chamber 14 and said second type of fluid, for example, a refrigerant, is condensed in the liquid-gas separation chamber 14.

The method of the present invention for absorbing and radiating heat by alternately pushing two different fluids includes the following steps:

(I) Actuate the first driving unit 11 so as to alternately push first and second fluids in the chamber 15 for them to flow from the pair of first fluid outlets 52 to the pair of fourth fluid inlets 55 via the first communicating tube 521 and the second communicating tube 522;

(II) Alternately push the first and the second fluids for them to flow out of the pair of third fluid outlets 54 and into the expansion tube 121 of the heat-exchange unit 12, at where heat exchange is proceeded and a mixed gas of the first and the second fluid is produced;

(III) Push the mixed gas into the liquid-gas confluence unit 13;

(IV) Send the mixed gas from the liquid-gas confluence unit 13 into the liquid-gas separation chamber 14;

(V) Discharge the first fluid, for example, the air, in the mixed gas from the liquid-gas separation chamber 14, and allow the second type of fluid, for example, the refrigerant, to condense into liquid phase; and (VI) Allow the second fluid, for example, the refrigerant, to flow into the right one of the two second fluid inlet 53 between the active magnet 16 and the left passive magnet 18.

The following are advantages of the miniature heat absorbing and radiating device and the heat absorbing and radiating method of the present invention by alternately pushing two different fluids with a driving unit:

(1) With the reciprocating motion of the first driving unit 11 and the provision of the first fluid outlets 52, the second fluid inlets 53, the third fluid outlets 54, and the fourth fluid inlets 55, two types of fluid, such as refrigerant and air, are alternately pushed through the device to proceed heat exchange.

(2) Heat produced from the heat source is brought away by the air, and low-temperature air is continuously sucked into the device to proceed effective heat exchange.

(3) The use of air to replace the thermal fins and cooling fans conventionally used in a heat-radiating unit largely reduces the space needed by the heat-radiating. unit and enables the same to be used in compact portable computers and mobile phones.

(4) The device of the present invention is an active heat-absorbing device operative to effectively lower temperature of a heat source.

In the above-described structure of the device according to the present invention, the expansion tube 121 further includes an uneven or a nap-finished inner wall surface to effectively hold the first and the second types of fluid to proceed a thorough heat exchange.

In the above-described structure of the device of the present invention, the liquid-gas separation chamber 14 further includes an uneven or a nap-finished inner wall surface to effectively enhance a structural strength thereof so as to bear the pressure from the mixed gas and to achieve the function of discharging the hot air and condensing the refrigerant into liquid.

In the above-described structure of the device of the present invention, the liquid-gas confluence unit 13 may include a goat-horn shaped tube having a diametrically expanded end and a diametrically reduced end. The expanded end of the liquid-gas confluence unit 13 is connected to and communicable with the outlet end of the expansion tube 121 and the reduced end of the liquid-gas confluence unit 13 is connected to and communicable with the liquid-gas separation chamber 14 to speed the flow of the mixed gas.

Figure 7:
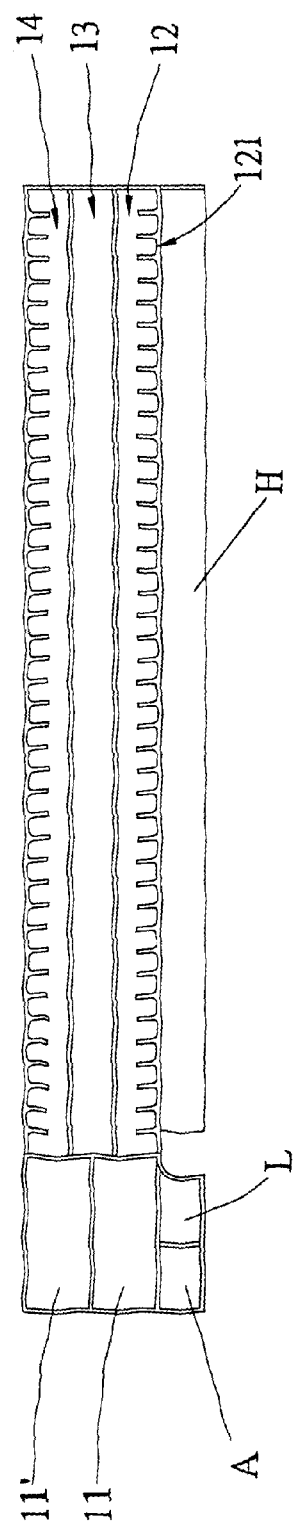
FIG. 7 is a sectional view showing the structure of the miniature heat absorbing and radiating device according to a second preferred embodiment of the present invention including the first and second fluid storage.
Figure 6:
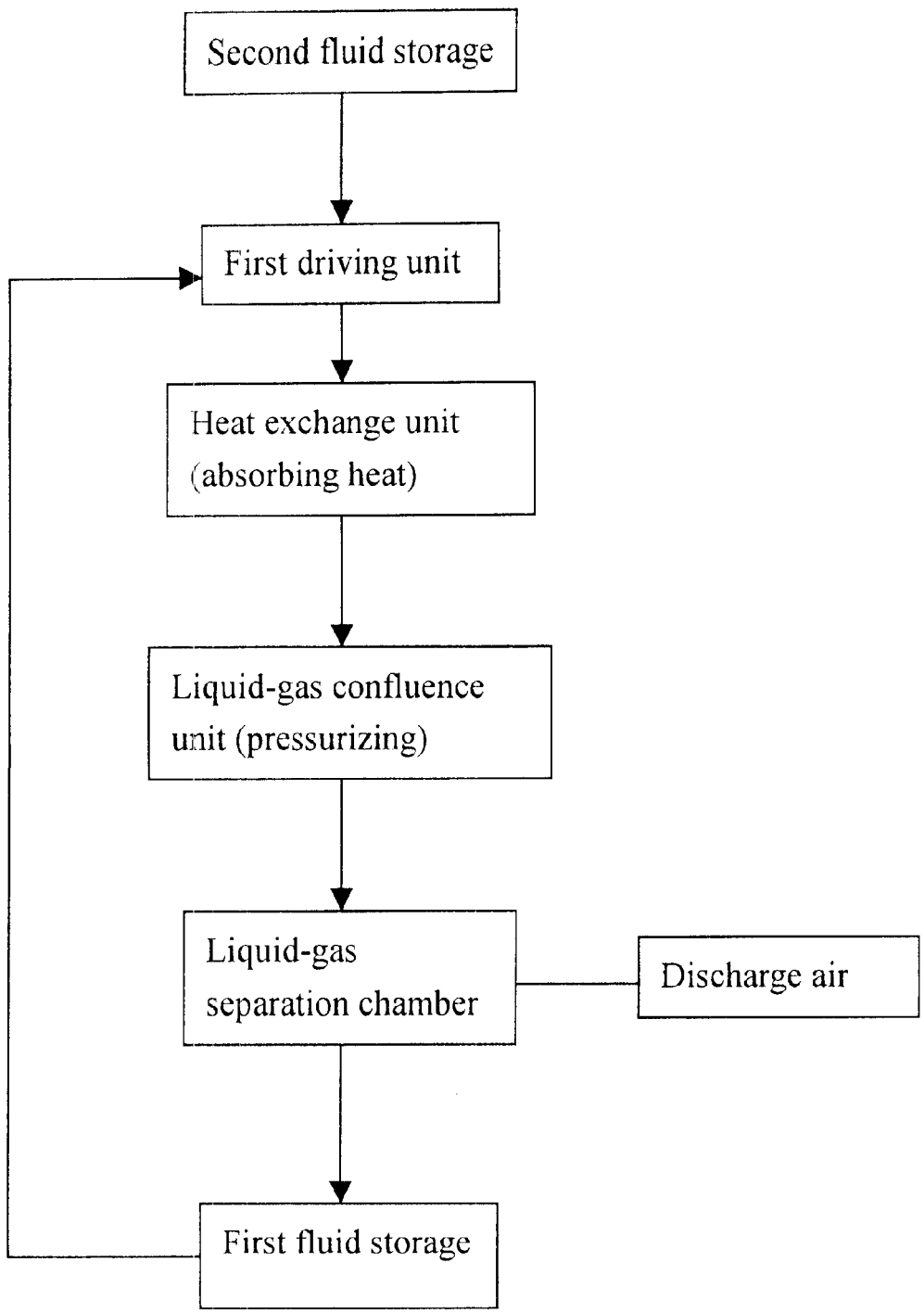
FIG. 6 is a flowchart showing steps of operation of the miniature heat absorbing and radiating device of FIG. 5.
Figure 8:
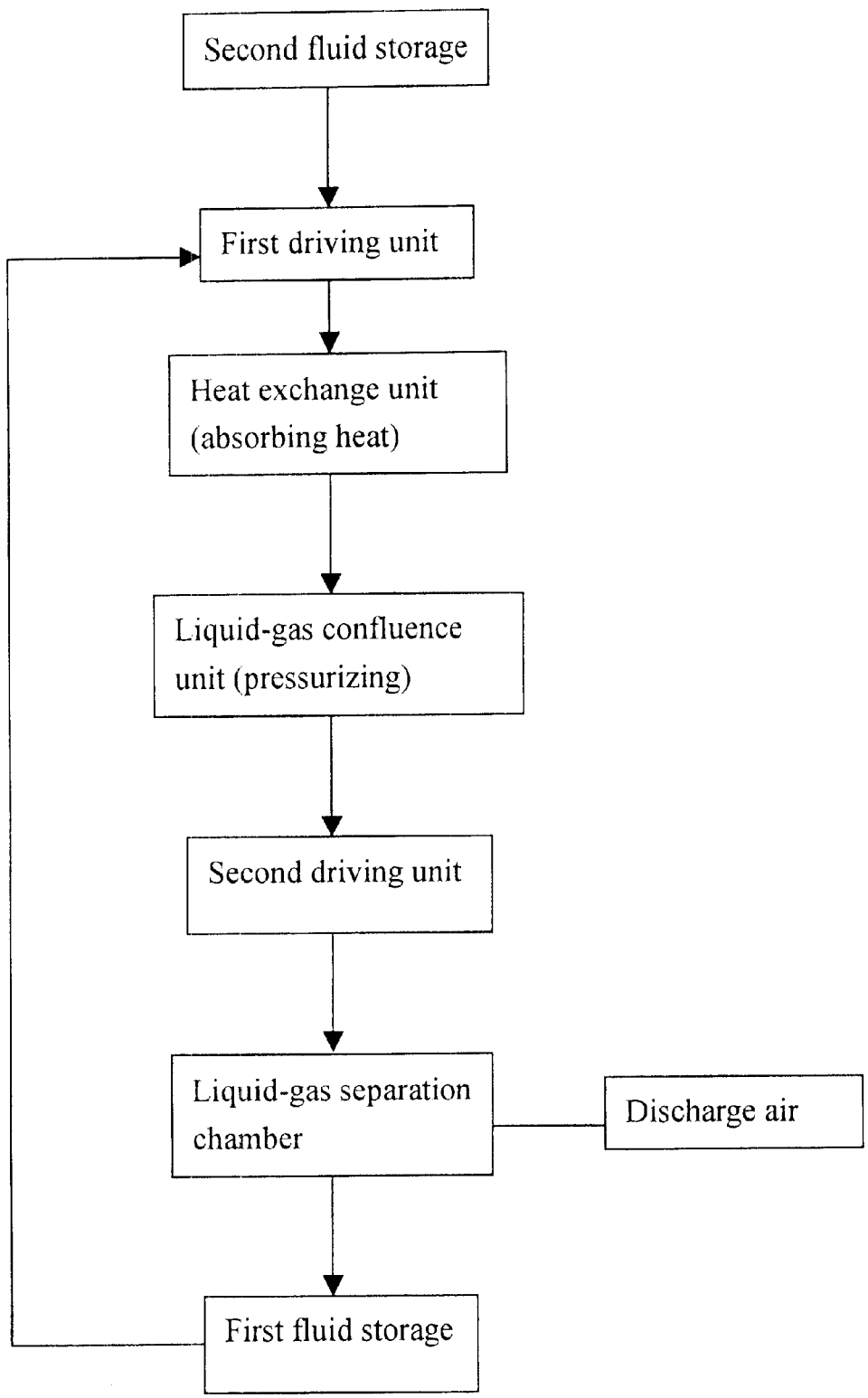
FIG. 8 is a flowchart showing steps of operation of the miniature heat absorbing and radiating device of FIG. 7.

Please refer to FIG. 7 that schematically shows the structure of the miniature heat absorbing and radiating device according to a second preferred embodiment of the present invention and to FIG. 8 that is a flowchart showing steps included in the heat absorbing and radiating method according to a second preferred embodiment of the present invention. In the second preferred embodiment, the device of the present invention further includes a second driving unit 11' structurally identical to the first driving unit 11; the liquid-gas confluence unit 13 is communicably connected at the outlet end to a pair of second fluid inlets of the second driving unit 11'; and the liquid-gas separation chamber 14 is communicably connected at an inlet end to a pair of third fluid outlets of the second driving unit 11' and at an outlet end to the right one of the two second fluid inlets 53 between the active magnet 16 and the left passive magnet 18 of the first driving unit 11; such that the objects of the present invention could be more effectively achieved. In the method of the second preferred embodiment of the present invention, the following steps are included:

(I) Actuate the first and the second driving unit 11, 11', so that the first driving unit 11 alternately pushes first and second fluids in the chamber 15 for them to flow from the pair of first fluid outlets 52 of the first driving unit 11 to the pair of fourth fluid inlets 55 of the first driving unit 11 via the first communicating tube 521 and the second communicating tube 522 of the first driving unit 11;

(II) Alternately push the first and the second fluid for them to flow out of the pair of third fluid outlets 54 of the first driving unit 11 and into the expansion tube 121 of the heat-exchange unit 12, at where heat exchange is proceeded and a mixed gas of the first and the second types of fluid is produced;

(III) Push the mixed gas into the liquid-gas confluence unit 13;

(IV) Send the mixed gas from the liquid-gas confluence unit 13 into a pair of second fluid inlets of the second driving unit 11';

(V) Push the mixed gas to pass a pair of third fluid outlets of the second driving unit 11' into the liquid-gas separation chamber 14; and (VI) Discharge the first fluid, for example, the air, in the mixed gas from the liquid-gas separation chamber 14, and allow the second fluid, for example, the refrigerant, in the mixed gas to condense into liquid phase and flow into the right one of the two second fluid inlet 53 between the active magnet 16 and the left passive magnet 18.

In the above-described structure of the device of the second preferred embodiment of the present invention having the second driving unit 11', the liquid-gas confluence unit 13 may be communicably connected at the outlet end to only one of the second fluid inlets of the second driving unit 11', permitting low-temperature air to be guided into another one of the second fluid inlets of the second driving unit 11'. This arrangement enables the device of the present invention to more effectively lower the temperature and to provide a pressurizing effect to separate the liquid from the air.

In this case, the above-described step (IV) is changed to send the mixed gas from the liquid-gas confluence unit 13 into one of a pair of second fluid inlets of the second driving unit 11'.

In the above-described structure of the device of the present invention, a first fluid storage L for storing the second type of fluid, for example, the refrigerant, may be further provided between the liquid-gas separation chamber 14 and the first driving unit 11 to obtain the same function of the present invention.

In the above-described structure of the device of the present invention, a second fluid storage A may be provided on the first communicating tube 521 to ensure accurate driving of the driving unit 11 and obtain the same function of the present invention.

What is claimed is:

1. A miniature heat absorbing and radiating device having a driving unit for pushing two different fluids alternately, comprising:

a first driving unit including a chamber, an active magnet, a pair of fixed magnets, and a pair of passive magnets;

said chamber being a tube having predetermined shape, length and internal space;

said active magnet having a predetermined length and an exterior shape corresponding to an interior shape of said chamber, and being adapted to reciprocatingly move within a middle section of said chamber; a coil being provided around an outer wall of said chamber at a portion corresponding to said active magnet to electrically connected to a circuit and thereby obtain from said circuit a cyclically variable current direction for said active magnet to reciprocate in said chamber;

said pair of fixed magnets being separately fixedly located at and spaced from two ends of said active magnet by a predetermined distance, and each said fixed magnet having a predetermined length and an exterior shape corresponding to the interior shape of said chamber;

said pair of passive magnets being separately located and reciprocatingly movable between said active magnet and each said fixed magnet, and each said passive magnet having a predetermined length and an exterior shape corresponding to the interior shape of said chamber;

said active magnet, said fixed magnets and said passive magnets being so arranged that ends thereof having the same polarity are located at the same side;

said chamber being provided on its wall at portions between said active magnet and one of said fixed magnets with a pair of first fluid outlets and a pair of second fluid inlets, such that when said active magnet reciprocates in said chamber and causes one of said passive magnet corresponding to said fixed magnet to move reciprocatingly, the following conditions are observed:

(A) When said passive magnet is moved leftward to reach a maximum displacement thereof, only one of said first fluid outlets that is located between said active magnet and said passive magnet is opened;

(B) When said passive magnet is moved rightward not to reach a maximum displacement thereof, one of said first fluid outlets that is located between said fixed magnet and said passive magnet as well as one of said second fluid inlets that is located between said active magnet and said passive magnet are opened, while another said first fluid outlet and another said second fluid inlet are closed; and (C) When said passive magnet is moved rightward to reach a maximum displacement thereof, only said first fluid outlet that is located between said active magnet and said passive magnet is closed;

said chamber being also provided on its wall at positions between said active magnet and another said fixed magnet with a pair of third fluid outlets and a pair of fourth fluid inlets, such that when said active magnet reciprocates in said chamber and causes another said passive magnet to move reciprocatingly, the following conditions are observed:

(D) When said passive magnet is moved leftward to reach a maximum displacement thereof, as previously described in (A), only one of said third fluid outlets that is located between said active magnet and another said passive magnet is closed;

(E) When said passive magnet is moved rightward not to reach a maximum displacement thereof, as previously described in (B), only another said third fluid outlet that is located between another said fixed magnet and another said passive magnet is opened; and (F) When said passive magnet is moved rightward to reach a maximum displacement thereof, as previously described in (C), only said third fluid outlet 54 that is located between said active magnet and another said passive magnet is opened;

a first communicating tube being provided to extend from said first fluid outlet between said fixed magnet and said passive magnet to said fourth fluid inlet between another said passive magnet and another said fixed magnet, in order to transfer a first fluid provided in said chamber; and a second communicating tube being provided to extend from another said first fluid outlet between said active magnet and said passive magnet to another said fourth fluid inlet between said active magnet and another said passive magnet, in order to transfer a second fluid provided in said chamber;

a heat-exchange unit including at least an expansion tube having a predetermined length; said expansion tube being communicably connected at an end to said pair of third fluid outlets, and an outer side of said expansion tube being pressed against a heat source;

a liquid-gas confluence unit being in the form of a tube having a predetermined length and communicably connected at an end to the other end of said expansion tube; and a liquid-gas separation chamber having a predetermined internal space and being communicably connected to another end of said liquid-gas confluence unit and to said second fluid inlets between said active magnet and said passive magnet, and said liquid-gas separation chamber being provided on its wall with an opening covered with a thin venting layer.

2. The miniature heat absorbing and radiating device as claimed in claim 1, further comprises a second driving unit structurally identical to said first driving unit, said second driving unit being provided between said liquid-gas confluence unit and said liquid-gas separation chamber; wherein said another end of said liquid-gas confluence unit being communicably connected to a pair of second fluid inlets on said second driving unit, and said liquid-gas separation chamber being communicably connected to a pair of third fluid outlets on said second driving unit.

3. The miniature heat absorbing and radiating device as claimed in claim 1, wherein said expansion tube has an uneven or a nap-finished inner wall surface.

4. The miniature heat absorbing and radiating device as claimed in claim 2, wherein said expansion tube has an uneven or a nap-finished inner wall surface.

5. The miniature heat absorbing and radiating device as claimed in claim 1, wherein said liquid-gas separation chamber has an uneven or a nap-finished inner wall surface.

6. The miniature heat absorbing and radiating device as claimed in claim 2, wherein said liquid-gas separation chamber has an uneven or a nap-finished inner wall surface.

7. The miniature heat absorbing and radiating device as claimed in claim 1, wherein said liquid-gas confluence unit is a goat-horn shaped tube having a diametrically expanded end communicably connected to said expansion tube and a diametrically reduced end communicably connected to said liquid-gas separation chamber.

8. The miniature heat absorbing and radiating device as claimed in claim 2, wherein said liquid-gas confluence unit is a goat-horn shaped tube having a diametrically expanded end communicably connected to said expansion tube and a diametrically reduced end communicably connected to said pair of second fluid inlets on said second driving unit.

9. The miniature heat absorbing and radiating device as claimed in claim 1, further comprises a first fluid storage provided between said liquid-gas separation chamber and said first driving unit.

10. The miniature heat absorbing and radiating device as claimed in claim 2, further comprises a first fluid storage provided between said liquid-gas separation chamber and said first driving unit.

11. The miniature heat absorbing and radiating device as claimed in claim 1, further comprises a second fluid storage provided on said second communicating tube.

12. The miniature heat absorbing and radiating device as claimed in claim 2, further comprises a second fluid storage provided on said second communicating tube.

13. The miniature heat absorbing and radiating device as claimed in claim 1, wherein said first fluid comprises air and said second fluid comprises a refrigerant.

14. The miniature heat absorbing and radiating device as claimed in claim 2, wherein said first fluid comprises air and said second fluid comprises a refrigerant.

15. The miniature heat absorbing and radiating device as claimed in claim 2, wherein said another end of said liquid-gas confluence unit is communicably connected to one of said pair of second fluid inlets on said second driving unit, so that low-temperature air is guided into said second driving unit via another one of said pair of second fluid inlets of said second driving unit to more effectively lower temperature and provide a pressurizing effect to separate liquid from air in said liquid-gas separation chamber.

16. A miniature heat absorbing and radiating device comprising a driving unit for pushing two different fluids alternately, said driving unit including a chamber, an active magnet, a pair of fixed magnets, and a pair of passive magnets;

said chamber being a tube having predetermined shape, length and internal space;

said active magnet having a predetermined length and an exterior shape corresponding to an interior shape of said chamber, and being adapted to reciprocatingly move within a middle section of said chamber; a coil being provided around an outer wall of said chamber at a portion corresponding to said active magnet to electrically connected to a circuit and thereby obtain from said circuit a cyclically variable current direction for said active magnet to reciprocate in said chamber;

said pair of fixed magnets being separately fixedly located at and spaced from two ends of said active magnet by a predetermined distance, and each said fixed magnet having a predetermined length and an exterior shape corresponding to the interior shape of said chamber;

said pair of passive magnets being separately located and reciprocatingly movable between said active magnet and each said fixed magnet, and each said passive magnet having a predetermined length and an exterior shape corresponding to the interior shape of said chamber;

said active magnet, said fixed magnets and said passive magnets being so arranged that ends thereof having the same polarity are located at the same side;

said chamber being provided on its wall at portions between said active magnet and one of said fixed magnets with a pair of first fluid outlets and a pair of second fluid inlets, such that when said active magnet reciprocates in said chamber and causes one of said passive magnet corresponding to said fixed magnet to move reciprocatingly, the following conditions are observed:

(A) When said passive magnet is moved leftward to reach a maximum displacement thereof, only one of said first fluid outlets that is located between said active magnet and said passive magnet is opened;

(B) When said passive magnet is moved rightward not to reach a maximum displacement thereof, one of said first fluid outlets that is located between said fixed magnet 17 and said passive magnet as well as one of said second fluid inlets that is located between said active magnet and said passive magnet are opened, while another said first fluid outlet and another said second fluid inlet are closed; and (C) When said passive magnet is moved rightward to reach a maximum displacement thereof, only said first fluid outlet that is located between said active magnet and said passive magnet is closed;

said chamber being also provided on its wall at positions between said active magnet and another said fixed magnet with a pair of third fluid outlets and a pair of fourth fluid inlets, such that when said active magnet reciprocates in said chamber and causes another said passive magnet to move reciprocatingly, the following conditions are observed:

(D) When said passive magnet is moved leftward to reach a maximum displacement thereof, as previously described in (A), only one of said third fluid outlets that is located between said active magnet 16 and another said passive magnet is closed;

(E) When said passive magnet is moved rightward not to reach a maximum displacement thereof, as previously described in (B), only another said third fluid outlet that is located between another said fixed magnet and another said passive magnet is opened; and (F) When said passive magnet is moved rightward to reach a maximum displacement thereof, as previously described in (C), only said third fluid outlet 54 that is located between said active magnet and another said passive magnet is opened;

a first communicating tube being provided to extend from said first fluid outlet between said fixed magnet and said passive magnet to said fourth fluid inlet between another said passive magnet and another said fixed magnet,. in order to transfer a first fluid provided in said chamber; and a second communicating tube being provided to extend from another said first fluid outlet between said active magnet and said passive magnet to another said fourth fluid inlet between said active magnet and another said passive magnet, in order to transfer a second fluid provided in said chamber.

17. A method for absorbing and radiating heat produced by a heat source in a very small space, comprising the steps of:

(I) Providing a miniature heat absorbing and radiating device having driving units for alternately pushing two different fluids as claimed in claim 3; actuating said first and said second driving unit, so that said first driving unit pushes alternately said first and said second fluid in said chamber of said first driving unit for them to flow from said pair of first fluid outlets of said first driving unit to said pair of fourth fluid inlets of said first driving unit via said first communicating tube and said second communicating tube of the first driving unit;

(II) Alternately pushing said first and said second fluid for them to flow out of said pair of third fluid outlets of said first driving unit and into said expansion tube of said heat-exchange unit, at where heat exchange is proceeded and a mixed gas of the first and the second types of fluid is produced;

(III) Pushing said mixed gas into said liquid-gas confluence unit;

(IV) Sending said mixed gas from said liquid-gas confluence unit into said pair of second fluid inlets of said second driving unit;

(V) Pushing said mixed gas to pass said pair of third fluid outlets of said second driving unit into said liquid-gas separation chamber; and (VI) Discharging said first fluid in said mixed gas from said liquid-gas separation chamber, and allow said second fluid in said mixed gas to condense into liquid phase and flow into said second fluid inlet between said active magnet and said passive magnet of said first driving unit.

18. A method for absorbing and radiating heat produced by a heat source in a very small space as claimed in claim 17, wherein said step (IV) is that sending said mixed gas from said liquid-gas confluence unit into one of said pair of second fluid inlets of said second driving unit.

19. A method for absorbing and radiating heat produced by a heat source in a very small space, comprising the steps of:

(I) Providing a miniature heat absorbing and radiating device having a driving unit for alternately pushing two different fluids as claimed in claim 1; actuating said first driving unit so as to alternately push said first and said second fluid in said chamber for them to flow from said pair of first fluid outlets to said pair of fourth fluid inlets via said first communicating tube and said second communicating tube;

(II) Alternately pushing said first and said second fluid for them to flow out of said pair of third fluid outlets and into said expansion tube of said heat-exchange unit, at where heat exchange is proceeded and a mixed gas of said first and said second fluid is produced;

(III) Pushing said mixed gas into said liquid-gas confluence unit;

(IV) Sending said mixed gas from said liquid-gas confluence unit into said liquid-gas separation chambe;

(V) Discharging said first fluid in said mixed gas from said liquid-gas separation chamber, and allow said second fluid to condense into liquid phase; and (VI) Allowing said second fluid to flow into said second fluid inlet between said fixed magnet and said passive magnet.

\* \* \* \* \*